(12) United States Patent
Tang et al.

(10) Patent No.: US 11,164,908 B2
(45) Date of Patent: Nov. 2, 2021

(54) VERTICAL INTERCALATION DEVICE FOR NEUROMORPHIC COMPUTING

(71) Applicant: INTERNATIONAL BUSINESS MACHINES CORPORATION, Armonk, NY (US)

(72) Inventors: Jianshi Tang, Elmsford, NY (US); Takashi Ando, Tuckahoe, NJ (US); Reinaldo Vega, Mahopac, NY (US); Praneet Adusumilli, Somerset, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 291 days.

(21) Appl. No.: 16/422,344

(22) Filed: May 24, 2019

(65) Prior Publication Data

US 2020/0373354 A1 Nov. 26, 2020

(51) Int. Cl.
*H01L 27/24* (2006.01)
*G06N 3/04* (2006.01)
*H01L 45/00* (2006.01)

(52) U.S. Cl.
CPC ............. *H01L 27/249* (2013.01); *G06N 3/04* (2013.01); *H01L 27/2418* (2013.01);
(Continued)

(58) Field of Classification Search
CPC ............... H01L 27/2481; H01L 27/249; H01L 27/2418; H01L 45/085; H01L 45/1233; H01L 45/124; H01L 45/145–147
See application file for complete search history.

(56) References Cited

U.S. PATENT DOCUMENTS 8,218,351 B2 7/2012 Bloch et al.
8,994,094 B2 3/2015 Matsuda
(Continued)

FOREIGN PATENT DOCUMENTS

WO 2016153516 A1 9/2016

OTHER PUBLICATIONS

Tang, "ECRAM as Scalable Synaptic Cell for High-Speed Low-Power Neuromorphic Computing", IEEE International Electron Devices Meeting, Dec. 2018, 4 pages.
(Continued)

*Primary Examiner* — Tucker J Wright
(74) *Attorney, Agent, or Firm* — Tutunjian & Bitetto, P.C.; Randall Bluestone

(57) ABSTRACT

A semiconductor device with an array of vertically stacked electrochemical random-access memory (ECRAM) devices, includes holes formed in a vertical stack of horizontal electrodes. The horizontal electrodes are horizontally aligned and stacked vertically at different vertical levels within the vertical stack and separated by first fill layers. The semiconductor device includes a stack deposition, including a channel layer, and an electrolyte layer, formed over the vertical stack and holes. Selector layers fill holes. The selector layers include an inner selector layer and outer selector layers. The channel layer, the electrolyte layer and outer selector layers are recessed to the inner selector layer and a fill layer is deposited over the vertical stack. The fill layer has been reduced down to the top of the inner selector layer.

20 Claims, 10 Drawing Sheets

(52) U.S. Cl.
CPC .......... *H01L 45/085* (2013.01); *H01L 45/145* (2013.01); *H01L 45/1683* (2013.01)

(56) References Cited

U.S. PATENT DOCUMENTS

| | | |
|---|---|---|
| 9,041,090 B2 | 5/2015 | Simsek-Ege et al. |
| 9,196,629 B2 | 11/2015 | Sakuma et al. |
| 9,466,612 B2 | 10/2016 | Kim et al. |
| 10,109,680 B1 * | 10/2018 | Wicklein ................ H01L 45/16 |
| 2006/0081950 A1 | 4/2006 | Kuhr et al. |

OTHER PUBLICATIONS

Baek, "Vertical Resistive Memory (VRRAM) Using Cost Effective 3D Process", International Electron Devices Meeting, Dec. 2011, 4 pages.

Jo, "Cross-Point Resistive RAM Based on Field-Assisted Superlinear Threshold Selector", IEEE Transactions on Electron Devices, vol. 62, No. 11, Nov. 2015, pp. 3477-3481.

Li, "Looking Ahead for Resistive Memory Technology: A Broad Perspective on ReRAM Technology for Future Storage and Computing", IEEE Consumer Electronics Magazine, Jan. 2017, pp. 94-103.

Wang, "Memristors with Diffusive Dynamics as Synaptic Emulators for Neuromorphic Computing", Nature Materials, Sep. 2016, pp. 101-110.

* cited by examiner

VERTICAL INTERCALATION DEVICE FOR NEUROMORPHIC COMPUTING

BACKGROUND

Technical Field

The present invention generally relates to neuromorphic computing, and more particularly to electrochemical random-access memory (ECRAM) devices, and methods of forming the same.

Description of the Related Art

An ECRAM is a memory device that includes a gate/reservoir that writes to an electrolyte/ion source, and a channel disposed under the electrolyte. The ECRAM also includes a source and drain. The memory is read across the source and drain. Cross talk in ECRAM is a common issue.

SUMMARY

In accordance with an embodiment of the present invention, a method for fabricating an array of vertically stacked electrochemical random-access memory (ECRAM) devices includes forming at least one hole in a vertical stack of horizontal electrodes. The method includes forming a stack deposition including a channel layer, and an electrolyte layer over the vertical stack and at least one hole. The method also includes depositing selector layers to fill the at least one hole. The selector layers include an inner selector layer and outer selector layers. The method further includes recessing the channel layer, the electrolyte layer and outer selector layers to the inner selector layer, and depositing a fill layer over the vertical stack. The method includes reducing the fill layer down to the top of the inner selector layer.

In accordance with an embodiment of the present invention, a semiconductor device with an array of vertically stacked electrochemical random-access memory (ECRAM) devices, includes at holes formed in a vertical stack of horizontal electrodes. The semiconductor device includes a stack deposition, including a channel layer, and an electrolyte layer, formed over the vertical stack and holes. Selector layers fill the holes. The selector layers include an inner selector layer and outer selector layers. The channel layer, the electrolyte layer and outer selector layers are recessed to the inner selector layer and a fill layer is deposited over the vertical stack. The fill layer has been reduced down to the top of the inner selector layer.

In accordance with an embodiment of the present invention, a semiconductor device with an array of vertically stacked electrochemical random-access memory (ECRAM) devices, includes holes formed in a vertical stack of horizontal electrodes. The semiconductor device includes a stack deposition, including a channel layer, and an electrolyte layer, formed over the vertical stack and the holes. The channel layer includes tungsten oxide ($WO_3$) and the electrolyte layer includes Lithium Phosphorous Oxynitride (LiPON). Selector layers fill the holes. The selector layers include an inner selector layer and outer selector layers. The inner selector layer includes at least one of copper (Cu) and silver (Ag). The channel layer, the electrolyte layer and outer selector layers are recessed to the inner selector layer and a fill layer is deposited over the vertical stack. The fill layer has been reduced down to the top of the inner selector layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
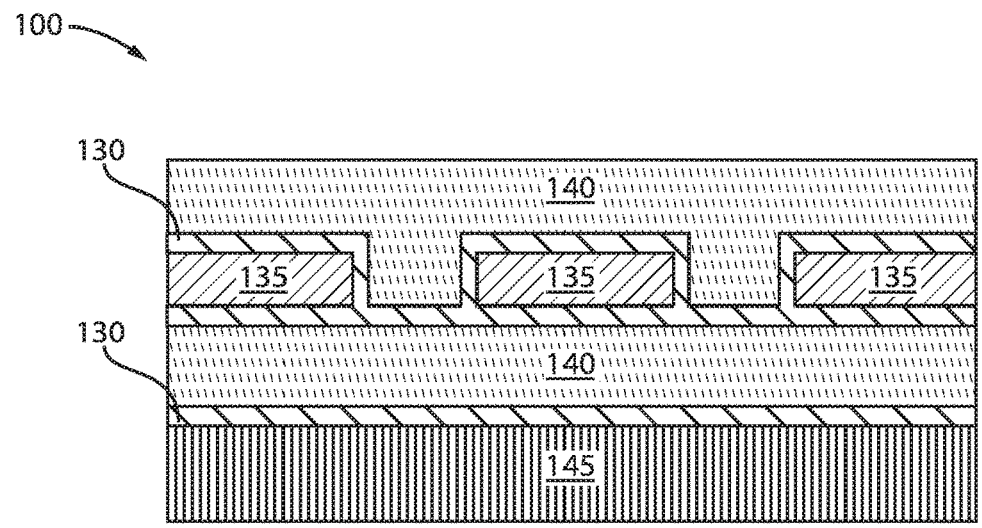
FIG. 1 is a cross-sectional view showing deposition of a horizontal electrode, in accordance with an embodiment of the present invention.

Embodiments of the present invention relate generally to forming three-dimensional (3D) arrays of vertical intercalation device(s) for neuromorphic computing. The embodiments provide a synaptic device that includes vertical cells, and a vertical selector. The various embodiments provide a 3D array of ECRAM devices vertically stacked inside a trench, whose benefits, compared to conventional ECRAM, include saving device area and also encapsulating the electrolyte. Example embodiments incorporate a nonvolatile ECRAM based on lithium phosphorous oxynitride (LiPON), with lithium (Li) or oxygen (O) ion intercalation in tungsten (tri)oxide ($WO_3$) for neuromorphic computing. Intercalation is the reversible inclusion or insertion of a molecule (or ion) into materials with layered structures.

Embodiments of the present invention also relate generally to providing a selector to allow programming of individual ECRAM without cross-talk by shutting off paths for charge transfer between adjacent ECRAM devices. Particular example embodiments can include, for example, a selector with one or more layers, such as a selector with a three layer selector with a titanium nitride (TiN) layer, a silicon oxynitride ($SiO_xN_y$) layer and a copper (Cu) layer (for example, $TiN/SiO_xN_y/Cu$) or a selector with a tungsten (W) layer, a $SiO_xN_y$ layer, and a silver (Ag) layer (for example, $W/SiO_xN_y/Ag$). Also, particular example embodiments can include a diffusive memristor with silver (Ag), $SiO_xN_y$ and platinum (Pt) layers (for example, $Ag/SiO_xN_y/Pt$) as a selector for neuromorphic computing. A memristor's electrical resistance is not constant but depends on the history of current that had previously flowed through the device. When current is turned off, the memristor retains a most recent resistance until the memristor is turned on.

The various example embodiments integrate a three-terminal electrochemical memory into a 3D structure in conjunction with selector devices.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 14 collectively and (substantially) sequentially illustrate an example embodiment of processes that may be implemented for fabricating a 3D array of ECRAM devices vertically stacked inside a trench.

An ECRAM is a lateral device, in which certain electrolytes (for example, such as Lithium Phosphorous Oxynitride (LiPON) or other Li-based electrolyte) are sensitive to exposure in air or humidity. The example embodiments encapsulate the ECRAM and prevent degradation. For parallel operation of ECRAM devices, selector devices (for example, transistors, mixed ionic electronic conductor (MIEC) stacks etc.) connected in series with the gate terminals of ECRAM are needed to avoid cross-talk with neighboring devices. The configurations of ECRAMs fabricated by the processes FIGS. 1 to 14 avoid the penalty in terms of device foot print that is associated with selector devices connected in series with the gate terminals of ECRAM.

Referring now to the drawings in which like numerals represent the same or similar elements and initially to FIG. 1, a cross-sectional view showing deposition of a horizontal electrode is illustrated.

As shown in FIG. 1, the device 100 includes a substrate 145. The substrate 145 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Germanium; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H).

The substrate 145 may be formed by, for example, various methods such as spinning from solution, spraying from solution, chemical vapor deposition (CVD), plasma enhanced CVD (PECVD), sputter deposition, reactive sputter deposition, ion-beam deposition, and evaporation, etc.

A barrier layer 131 (for example 131-1) is deposited on the substrate 145. As will be described further herein with respect to FIG. 10, the barrier layer 131 can be used as a ground plane in the device. The barrier can be selected from the group that includes nitrides (e.g., SiN), carbonitrides (e.g., SiCN, SiBCN, and SiOCN), organosilicate glass (OSG), oxides (e.g., fluorine doped silicon dioxide, carbon doped silicon dioxide, porous silicon dioxide, and porous carbon doped silicon dioxide), spin-on materials (e.g., spin-on organic polymeric dielectrics and spin-on silicon based polymeric dielectrics), etc.

A fill layer 140 can be added to the structure. The fill may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Germanium; etc.

A horizontal electrode 135 can be formed by depositing layers for the horizontal electrode 135 and patterning. Horizontal electrode 135 can be formed by depositing an electrode layer material, and patterning the electrode layer material (e.g., by using an etch mask, performing reactive ion etching (RIE), chemical-mechanical planarization (CMP), etc.). The horizontal electrode 135 can include any suitable material in accordance with the embodiments described herein. Examples of suitable materials that can be included in the horizontal electrode 135 include, but are not limited to, titanium-based materials (e.g., titanium nitride materials (e.g., TiN)), tantalum-based materials (e.g., tantalum nitride materials (e.g., TaN)), and tungsten-based materials (e.g., W). After each deposition, excess material can be etched, planarized and/or recessed from the semiconductor device with a suitable etch or planarization process. The horizontal electrode 135 may be composed of one uniform material.

After patterning for the horizontal electrodes 135, a barrier/liner layer 130 is deposited over the horizontal electrode 135. Another fill layer 140 is added over the horizontal electrodes 135 (and barrier layers 130) and a planarization process, such as, for example, chemical mechanical planarization (CMP) is performed on the upper surface of the fill layer 140.

According to an example embodiment, the structure can be formed by forming a foundation, for example, a barrier layer 131 (for example, SiN) on a substrate 145 (for example, a metal, etc.) and thereafter, forming layers of horizontal electrodes 135 stacked first upon the foundation and then upon each other. Each horizontal electrode 135 can be formed by depositing, layering and patterning layers of SiN (barrier 130), then TiN (horizontal electrode 135) and then SiN (130) on $SiO_2$ (fill layer 140).

Figure 2:
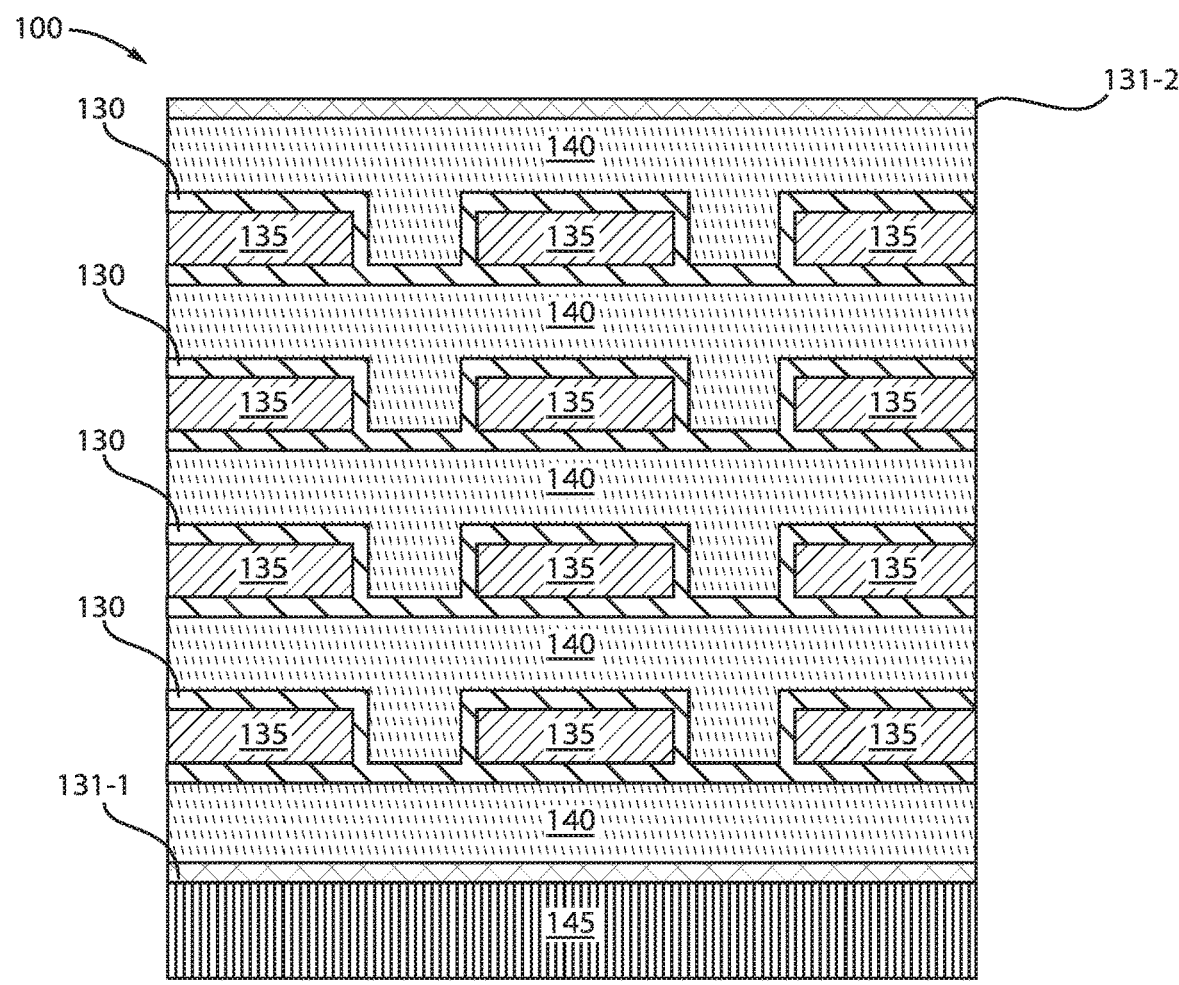
FIG. 2 is a cross-sectional view showing a vertical stack of horizontal electrodes, in accordance with an embodiment of the present invention.

With reference to FIG. 2, a cross-sectional view illustrating a vertical stack of horizontal electrodes 100 is shown, in accordance with example embodiments.

As described with respect to FIG. 1, herein above, a vertical stack of horizontal electrodes 100 can be formed by multiple deposition of electrode layers 135 (and barrier layers 130) on fill layers 140 (with patterning to form the electrodes 135). For example, in one embodiment the vertical stack of horizontal electrodes 100 can be formed from SiN (barrier layer 130)/TiN (electrode layer 135)/SiN (barrier layer 130) layers on $SiO_2$ (fill layer 140). The process can be repeated to form a required number of electrodes in the vertical stack. As shown in FIG. 2, the device includes four levels of stacked electrodes but in other implementations, the stacks can include fewer or more levels (for example, as required).

At the top of the horizontal electrode stack, a top barrier layer 131-2, which can be used as a ground plane, is deposited over the structure. The top barrier layer 131-2 can then be planarized, for example, via CMP or other suitable process.

Figure 3:
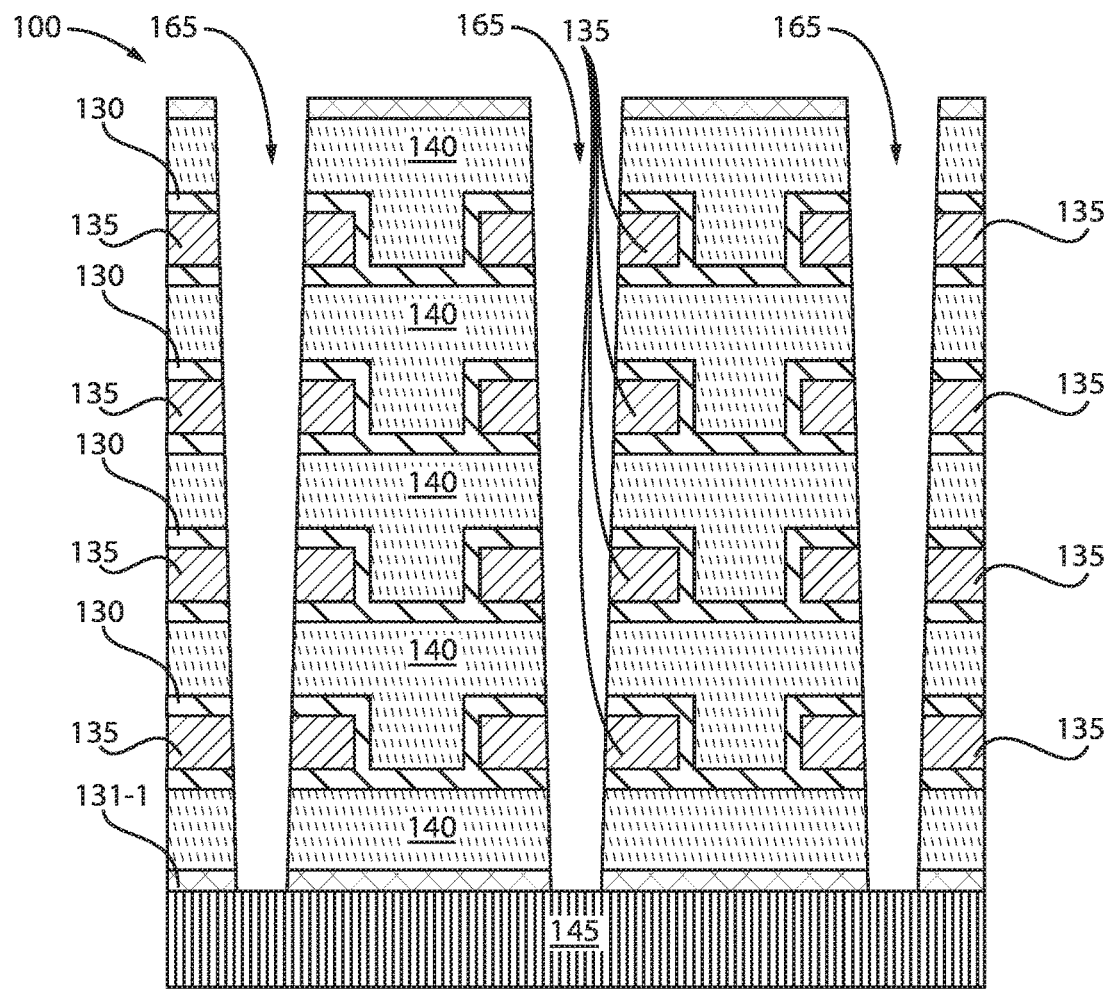
FIG. 3 is a cross-sectional view showing etch formed holes into the vertical stack of FIG. 2, in accordance with an embodiment of the present invention.

FIG. 3 is a cross-sectional view showing (for example, etch drilled) holes into the vertical stack of FIG. 2, in accordance with example embodiments.

Holes 165 can be formed in the vertical stack of horizontal electrodes 100. For example, etch drilled holes 165 can be made in the vertical stack of horizontal electrodes 100. The holes 165 can be patterned, for example, using such processes as a wet chemical etch or a dry etch. The holes 165 are formed through the horizontal electrodes 135, exposing horizontal electrode layers 135 that can be otherwise encapsulated in barrier layers 130.

Figure 4:
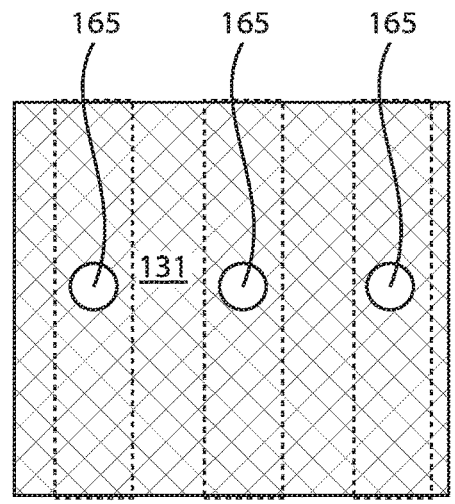
FIG. 4 is a top view showing etch drilled holes into the vertical stack of FIG. 2, in accordance with an embodiment of the present invention.

FIG. 4 is a top view showing (for example, etch drilled) holes into the vertical stack of FIG. 2, in accordance with example embodiments.

As shown in FIG. 4, the holes 165 can be circularly and centrally disposed through the horizontal electrodes 135. The holes 165 may be etched, drilled, etc., into the structure.

Figure 5:
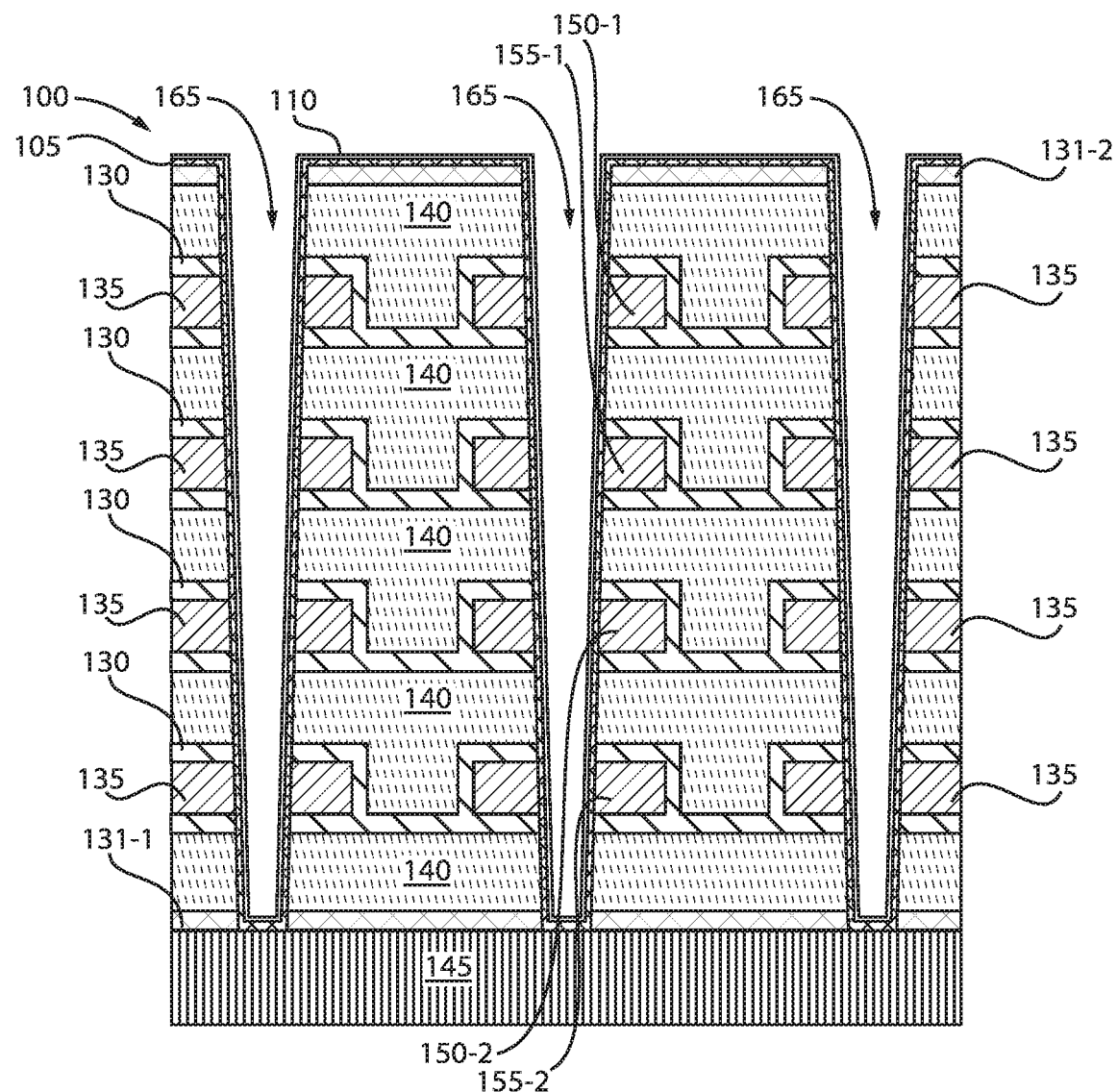
FIG. 5 is a cross-sectional view showing channel and electrolyte deposition on the vertical stack of FIG. 3, in accordance with an embodiment of the present invention.

FIG. 5 is a cross-sectional view showing stack deposition on the vertical stack of FIG. 3, in accordance with example embodiments. The stack can include a channel layer and an electrolyte layer.

As shown, channel material 105 can be formed on the etch drilled stack of FIG. 3. The channel material 105 can be deposited in a layer covering the walls and bottom of the etch drilled hole, as well as the top surface of the structure (for example, over the portions of the top barrier layer 131-2 that have not been drilled). For example, the channel material 105 can include a semiconductor material, such as tungsten oxide ($WO_3$) An electrolyte 110 (e.g., lithium phosphorous oxy-nitride (LiPON)) deposition can be added by sputtering or other suitable techniques. A stack of layers is thereby formed over the etched holes and top barrier layer. The stack of layers includes the channel layer 105 and the electrolyte 110. The channel 105 and electrolyte 110 deposition will cover the walls of the hole 165, as well as the remaining top surface of the vertical stack of horizontal electrodes 100.

The resulting structure includes a source 150 (for example, 150-1 and 150-2) and drain 155 (155-1 and 155-2) of each vertically stacked ECRAM device with the channel and electrolyte.

Figure 6:
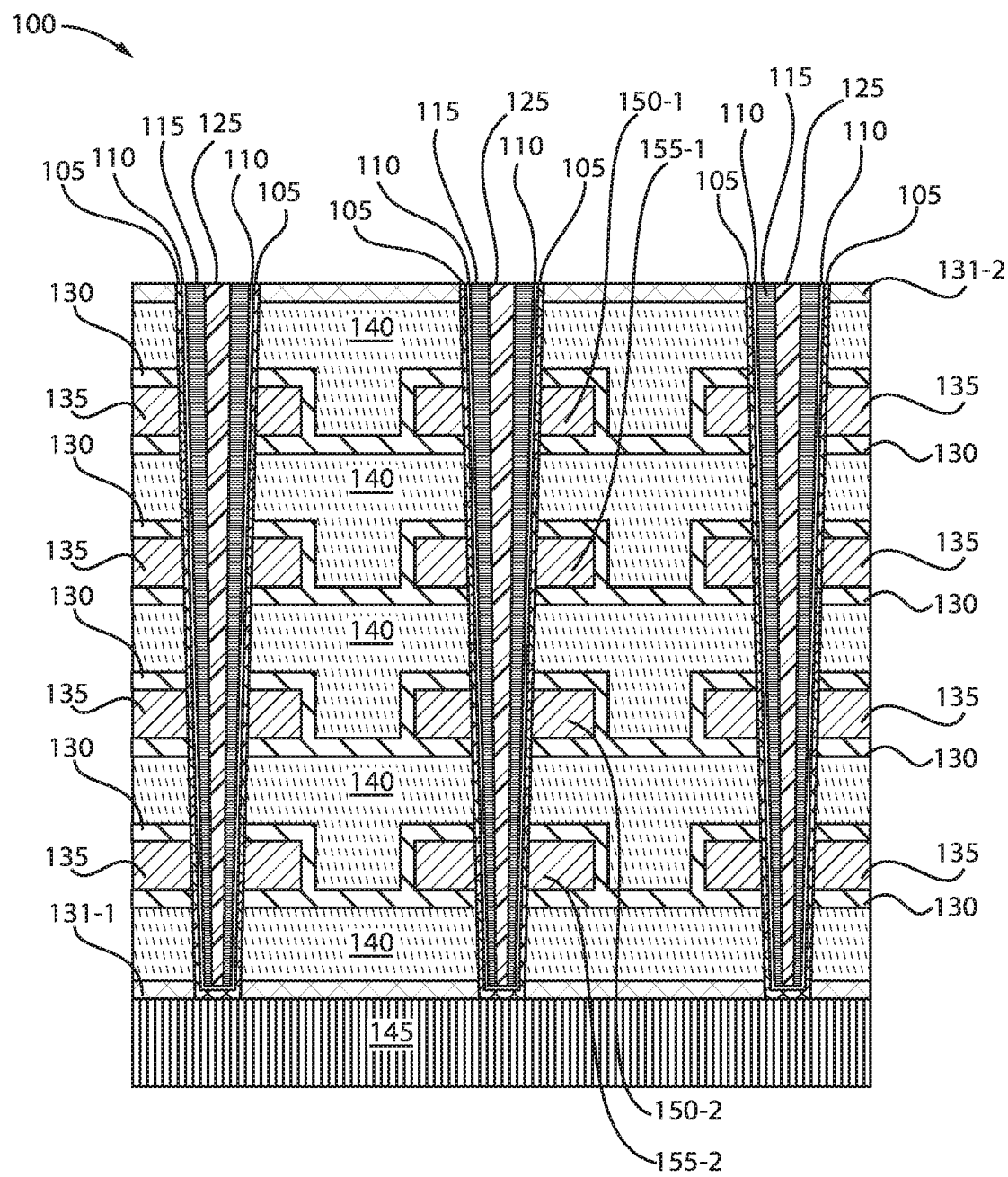
FIG. 6 is a cross-sectional view showing deposit of selector layers and chemical mechanical planarization (CMP) stopping on a barrier layer, in accordance with an embodiment of the present invention.

FIG. 6 is a cross-sectional view showing deposit of selector layers and chemical mechanical planarization (CMP) stopping on a barrier layer, in accordance with example embodiments.

A three layer selector device can be added to the structure. Selector layers 115, 120 and 125 can be added to the vertical stack of FIG. 5. For example, the selector layers 115, 120, and 125 can be deposited to fill the (for example, etched drilled) holes 165. The selector layers 115, 120 and 125 can allow programming of individual ECRAM devices without cross-talk. In some embodiments, the first 115, second 120 and third 125 selector layers are chosen based on their (for instance, combined) properties as a diffusive memristor. Particular example embodiments of the selector include a titanium nitride (TiN) layer 115, silicon oxynitride ($SiO_xN_y$) layer 120 and copper (Cu) layer 125 selector or a tungsten (W) layer 115, $SiO_xN_y$ layer 120 and silver (Ag) layer 125 selector. Further example embodiments of the selector for neuromorphic computing include an Ag layer 115, a $SiO_xN_y$ layer 120 and a Pt layer 125.

After deposit of selector layers 115, 120, and 125 to fill the hole 165, the upper surface of the vertical stacks can be smoothed (for example, polished, evened, etc., via CMP or other suitable process) stopping on the barrier layer 130 (for example, SiN).

Figure 7:
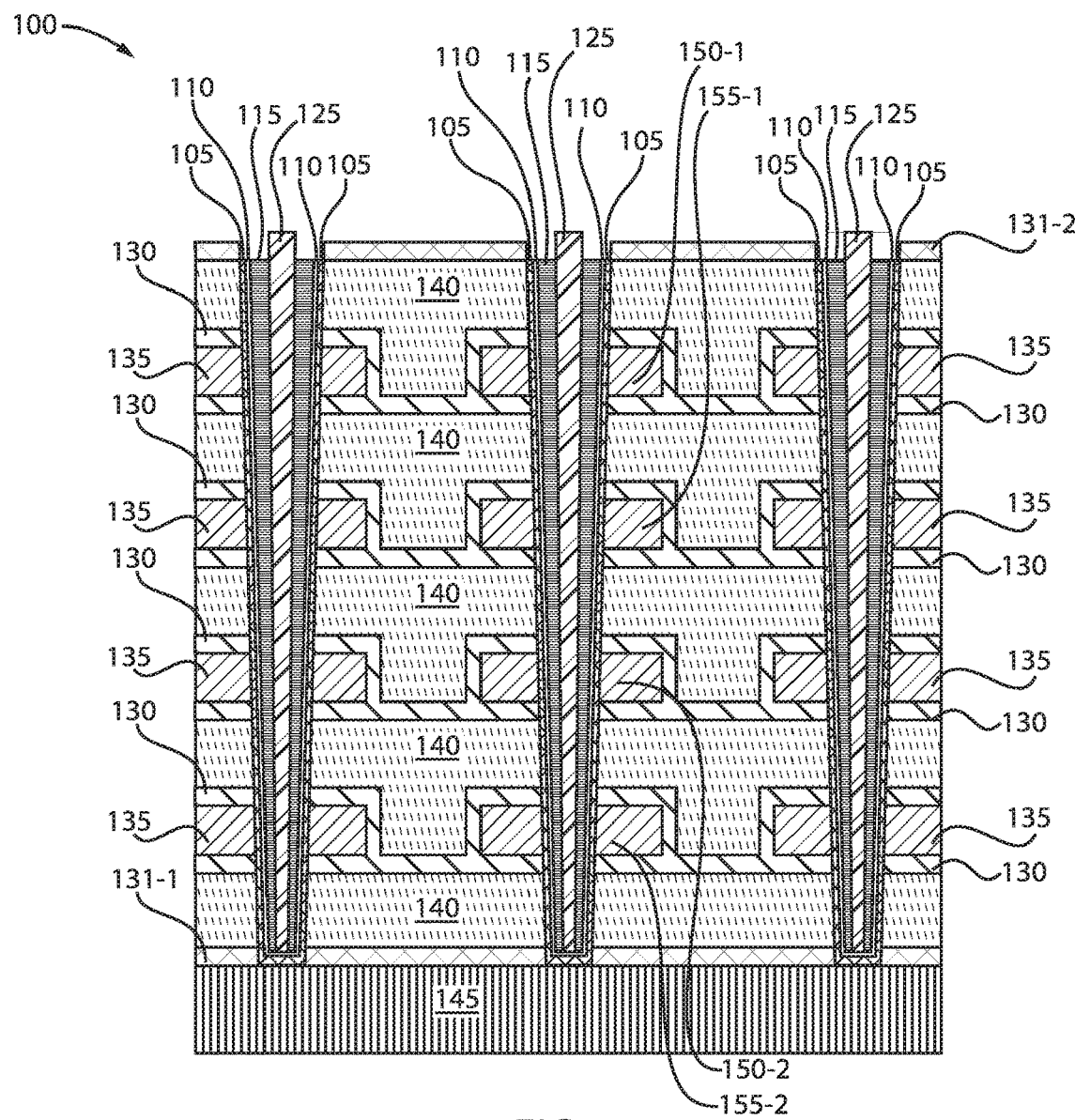
FIG. 7 is a cross-sectional view showing recess of the channel, electrolyte and outer selector layers of the vertical stack, in accordance with an embodiment of the present invention.

Referring now to FIG. 7, there is shown a cross-sectional view of recess of the channel, electrolyte and outer selector layers of the vertical stack, in accordance with example embodiments.

The channel 105, electrolyte 110 and outer selector layers 115, and 120 (e.g., $WO_3$ (channel 105), LiPON (electrolyte 110), TiN and $SiO_xN_y$ (outer selector layers 115, and 120) or other suitable combination of layers) are recessed, for example by wet etching or other suitable process, from the centrally disposed selector layer 125 (for example, a metal layer, such as Ag). The recess process exposes a portion of the central selector layer 125, which is not etched or recessed and extends (or protrudes) from the other selector layers.

Figure 8:
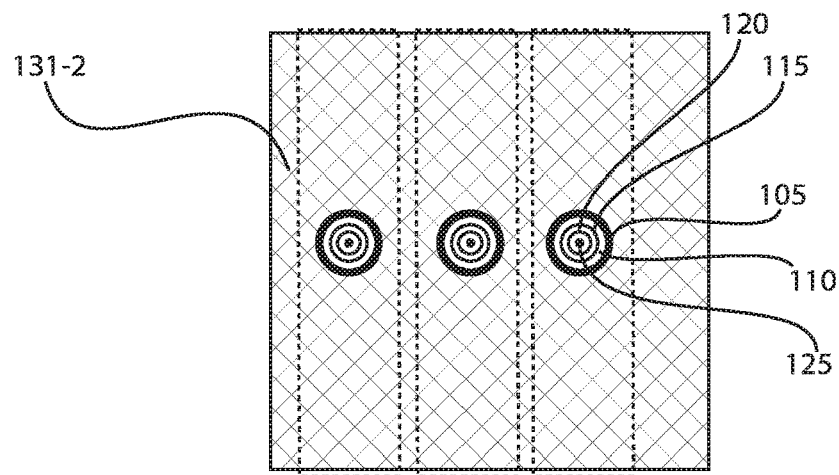
FIG. 8 is a top view showing recess of the channel, electrolyte and outer selector layers of the vertical stack, in accordance with an embodiment of the present invention.

As shown in the top view of FIG. 8, the recessed channel 105, electrolyte 110 and outer selector layers 115 and 120 (for example, $WO_3$, LiPON, TiN, and SiOxNy layers), are substantially disposed as concentric circles formed around the central selector layer 125, which is not recessed. From the top view perspective, all channel 105, electrolyte 110, and selector layers 115, 120 and 125 now fill the opening in the vertical stack made by the etched holes 165.

Figure 9:
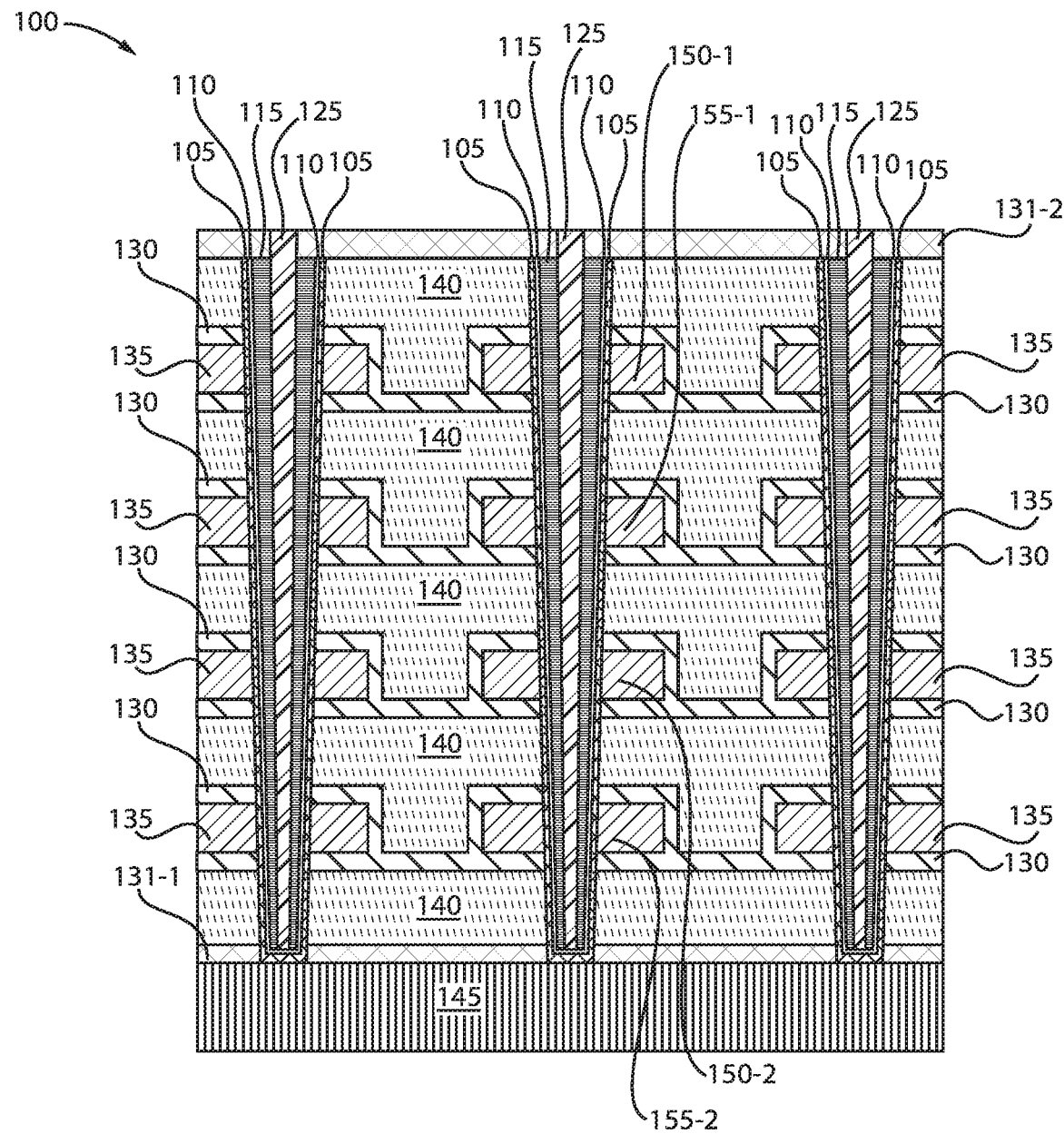
FIG. 9 is a cross-sectional view showing fill applied to the vertical stack of FIG. 8, in accordance with an embodiment of the present invention.

FIG. 9 is a cross-sectional view showing fill applied to the vertical stack of FIG. 7, in accordance with example embodiments.

As shown in FIG. 9, a fill layer 130 (for example, an SiN layer) can be applied to the vertical stack of horizontal electrodes of FIG. 7. The fill layer 130 covers the channel 105, electrolyte 110 and selector layers 115, 120 including the central selector layer 125. The central selector layer 125 protrudes into the fill layer 130 at above the plane of the fill layer 140 (for example, above an $SiO_2$ layer).

Figure 10:
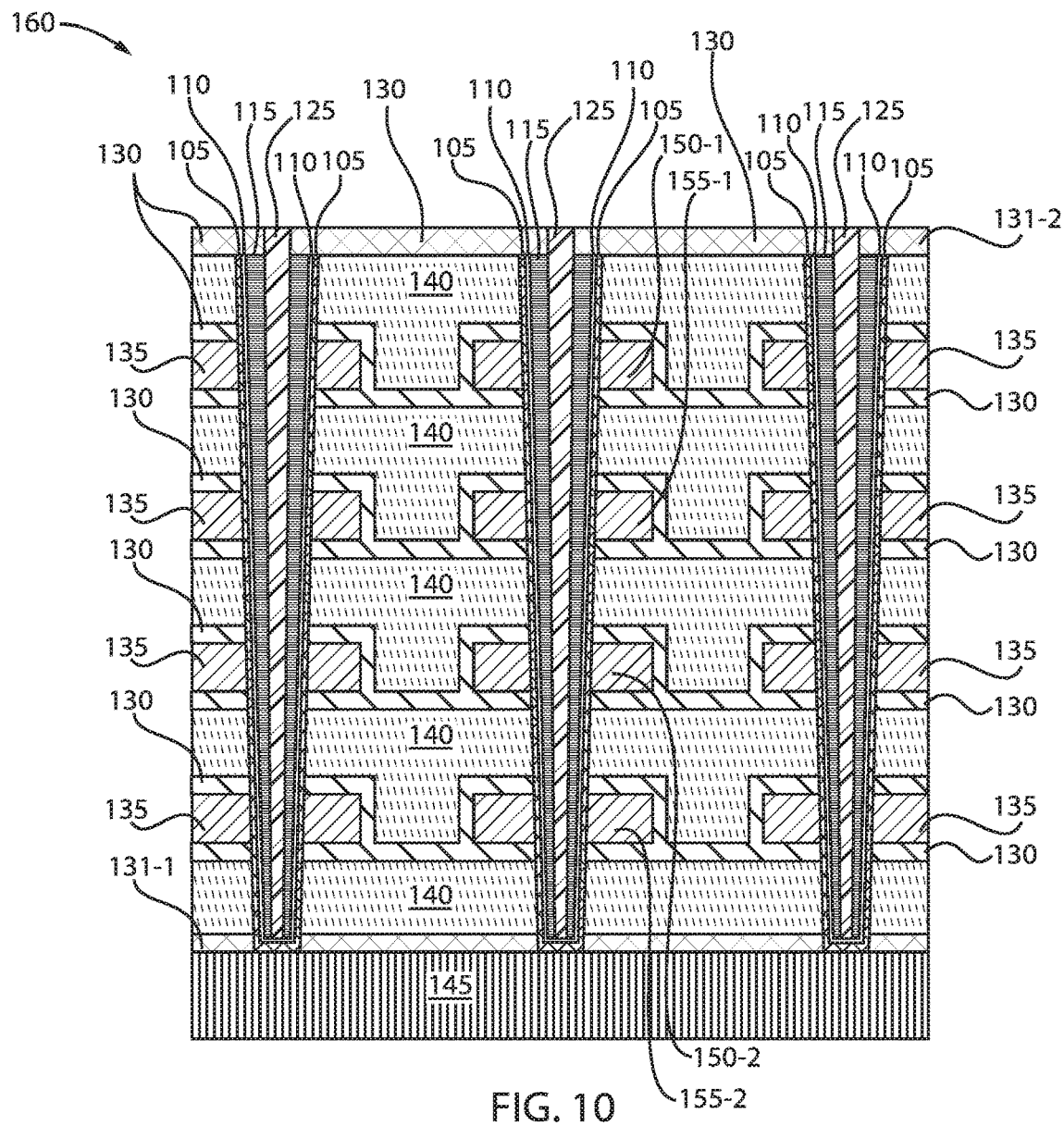
FIG. 10 is a cross-sectional view showing an array of electrochemical random-access memory (ECRAM) vertically stacked inside trenches, in accordance with an embodiment of the present invention.

FIG. 10 is a cross-sectional view showing an array 160 of ECRAM vertically stacked inside trenches, in accordance with example embodiments.

The surface of the fill layer covered vertical stack of FIG. 9 is planarized (for example, smoothed, reduced, etc.) down to the top of the central (inner) selector layer 125 (for example, a conductive material such as Cu or Ag). For example, the fill layers 130 can be reduced via CMP stopping on the central selector layer 125 (for example, on Cu or Ag). As shown in the top view of FIG. 11, the central selector layer 125 is exposed by the smoothing process.

The resulting structure includes an array 160 of ECRAM devices vertically stacked inside trenches. The ECRAM devices are prevented from cross talk by use of the vertical selector which is grounded at layers 131-1 and 131-2. The vertical selector prevents charge transfer between neighboring ECRAM devices and thereby suppresses cross talk.

Figure 12:
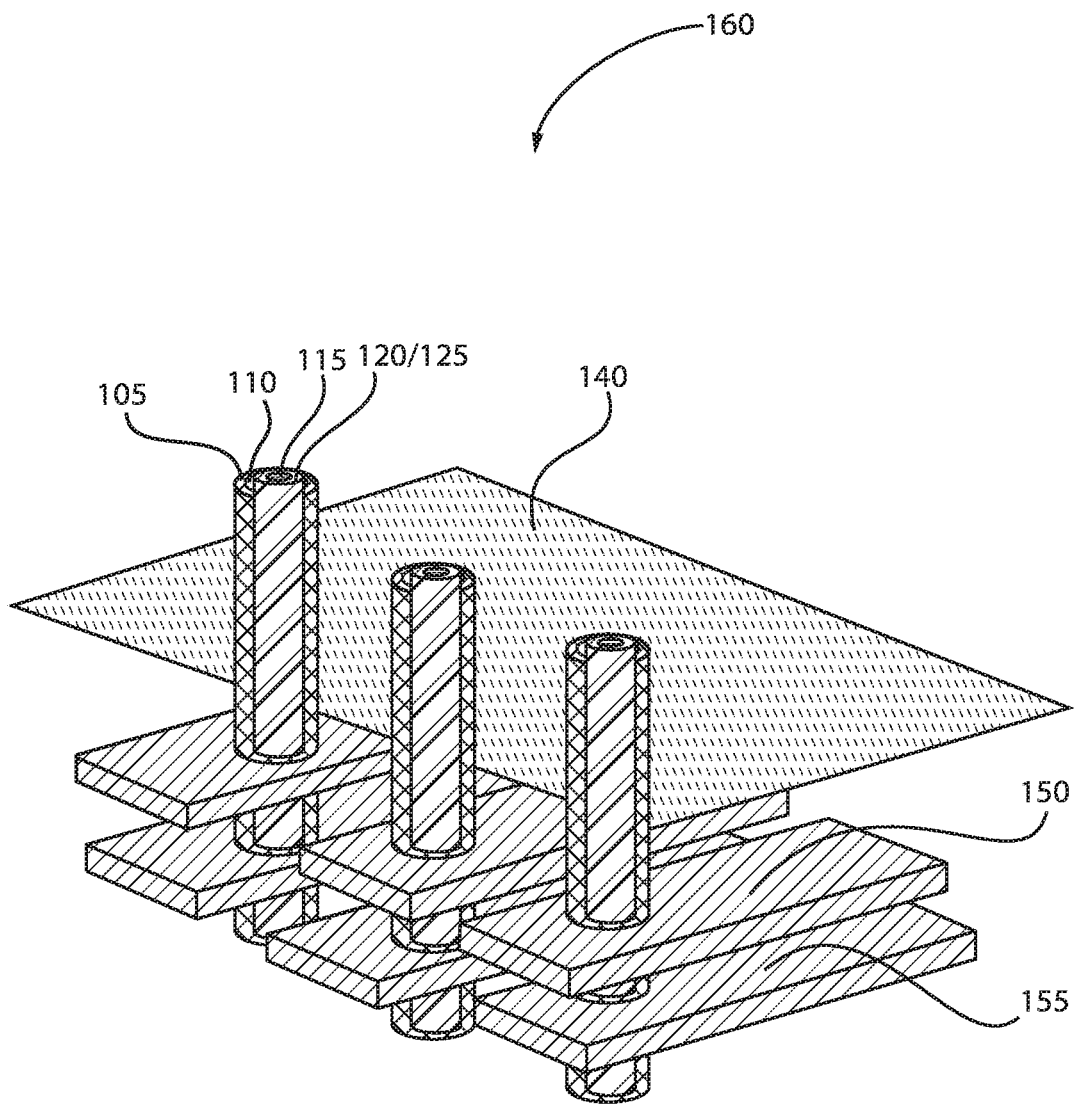
FIG. 12 is a three-dimensional view showing an array of ECRAM devices vertically stacked inside trenches, in accordance with an embodiment of the present invention.

FIG. 12 is a three-dimensional view (with other layers not shown for clarity) showing the array 160 of ECRAM devices vertically stacked inside trenches with horizontal electrodes. The array 160 of ECRAM devices vertically stacked inside trenches saves device area (when compared to, for example, parallel ECRAM devices with selector devices connected in series with the gate terminals of the ECRAM devices). The electrolyte 110 is also encapsulated in the array 160 of ECRAM devices vertically stacked inside trenches, thereby protecting the device from degradation. The selector devices are formed within the vertical trench. The memory element in these instances are three-terminal devices.

The 3D arrays of vertical intercalation device can be used for neuromorphic computing. The diffusive memristor (for example, memristors with layers such as TiN, SiOxNy, and Cu or W, SiOxNy, and Ag) used by device 160 as a selector allows programming of individual ECRAM devices without cross-talk. The selector is connected in series of multiple three-terminal electrochemical RAM (ECRAM) devices.

Figure 13:
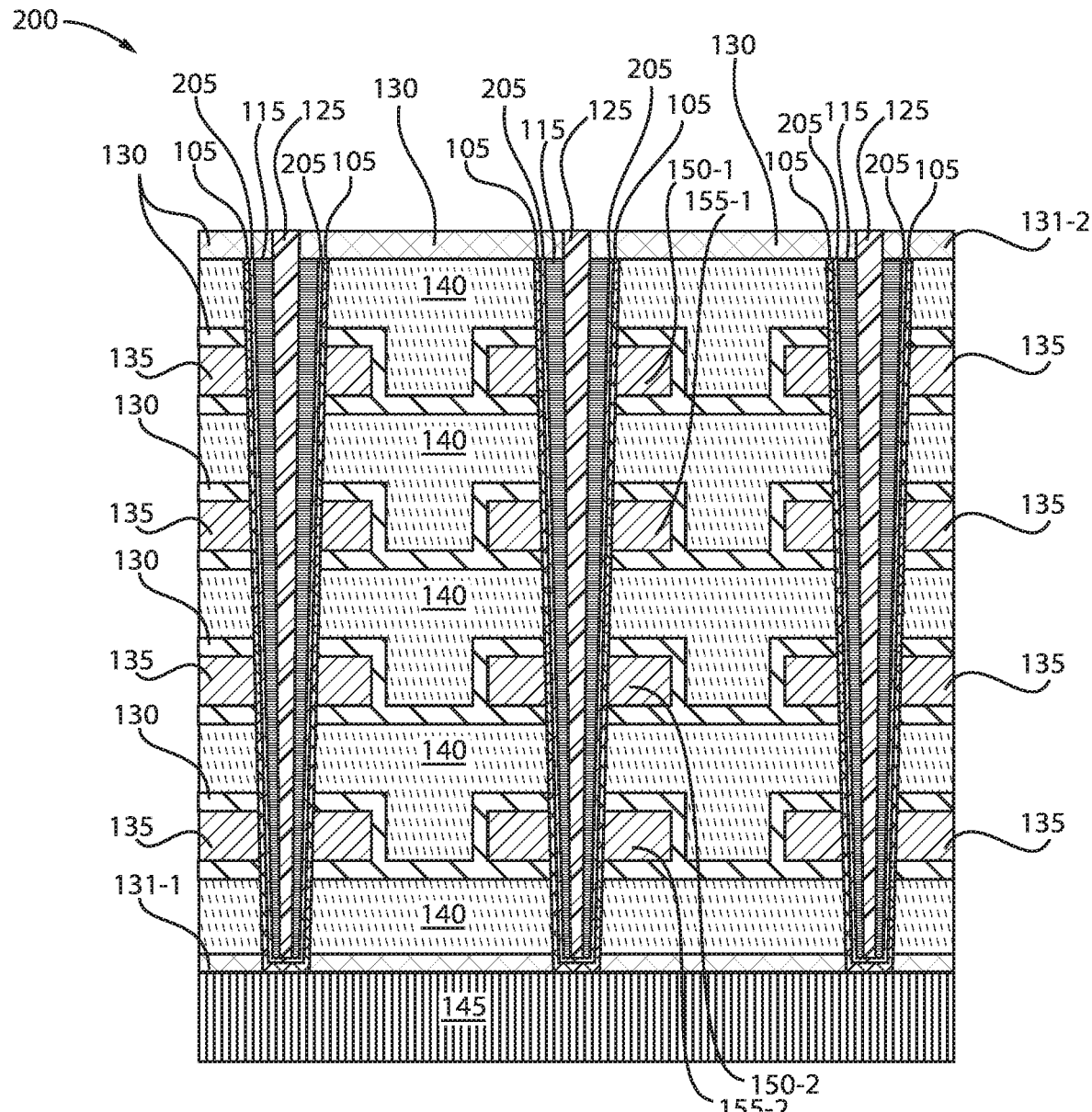
FIG. 13 is a cross-sectional view showing an array of ECRAM devices vertically stacked inside trenches, in accordance with an embodiment of the present invention.

FIG. 13 is a cross-sectional view showing another embodiment of an array 200 of ECRAM vertically stacked inside trenches, in accordance with another embodiment of the present invention.

Figure 11:
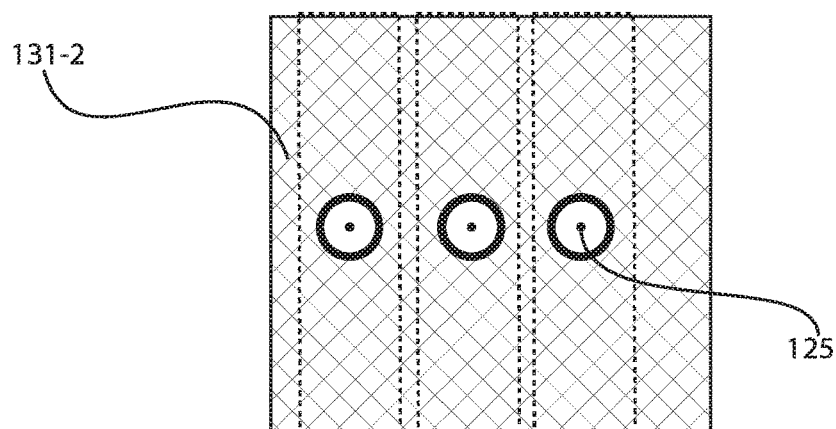
FIG. 11 is a top view showing an array of ECRAM devices vertically stacked inside trenches, in accordance with an embodiment of the present invention.

According to various example embodiments, the oxygen intercalation device can include an electrolyte 205 such as hafnium oxide ($HfO_2$)/cerium oxide (CeO) as a substitute for LiPON 110 as described with respect to FIGS. 10-12 herein above. Electrochemical intercalation of oxygen atoms from the electrolyte 205 into the channel material 105 allows tuning of the channel resistance.

Figure 14:
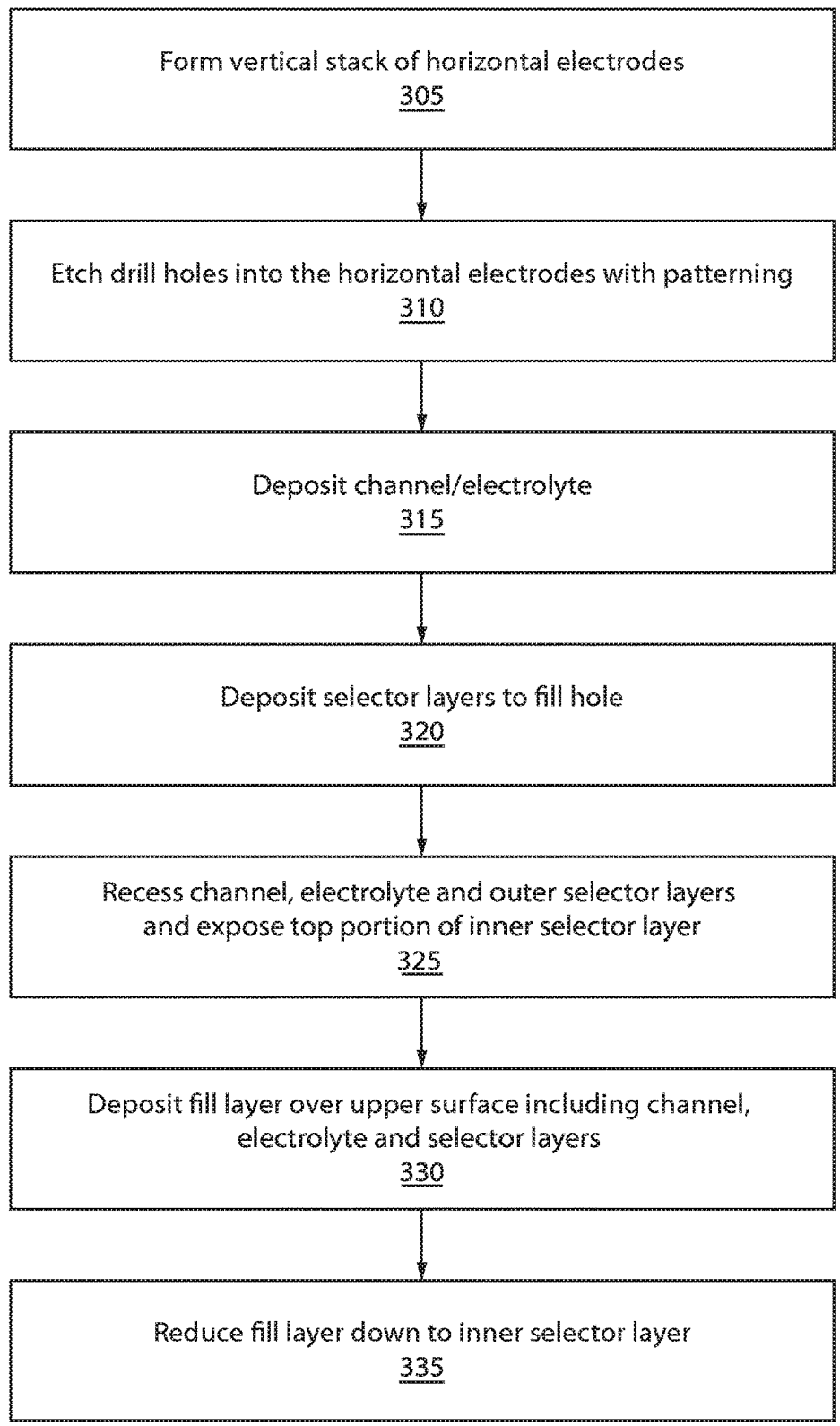
FIG. 14 is a flow diagram showing a method of fabricating an array of ECRAM devices vertically stacked inside trenches, in accordance with an embodiment of the present invention.

With reference to FIG. 14, a flow diagram is shown illustrating a method 300 of forming an array of ECRAM devices vertically stacked inside trenches, in accordance with an embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 305, a vertical stack of horizontal electrodes 135 is formed. For example, the vertical stack can be formed by multiple deposition of electrode layers 135 and barrier layers 13) on fill layers 140 (for example, SiN, TiN, and SiN layers formed on $SiO_2$) with patterning, as described with respect to FIG. 2 herein above. The horizontal electrodes 135 are horizontally aligned and stacked vertically at different vertical levels with the vertical stack and separated by fill layers. The vertical levels can be viewed from a perspective as increasing in height relative to the horizontal plane along which the electrodes are formed.

At block 310, (for example, etch drilled) holes 165 are formed through (into) the horizontal electrodes (for example, TiN) with patterning. The etched drilled holes 165 vertically penetrate the vertically stacked horizontal electrodes to the substrate level.

At block 315, a channel and an electrolyte are formed in the etch drilled holes, for example, by deposition.

At block 320, selector layers (for example, TiN, $SiO_xN_y$, and Cu) are inserted (for example, deposited) to fill the etch drilled holes 165 and planarization (for example, CMP) that stops on the barrier layer 130 is applied to the vertically stacked electrodes.

At block 325, the flow diagram includes recessing channel, electrolyte and outer selector layers and exposing a top (upper) portion of inner selector layer 125. For example, the manufacturer or fabricator can recess the channel, electrolyte and outer selector layers (for example, $WO_3$, LiPON, TiN, and $SiO_xN_y$ layers) stopping, for example, on the inner selector layer (for example, Ag or Cu layer). The channel, electrolyte and outer selector layers can be recessed by, for example, wet etching.

At block 330, the upper surface of the vertically stacked horizontal electrodes (including channel, electrolyte and selector layers) is filled, for example, with a (dielectric) fill layer 130 such as SiN.

At block 335, the fill layer 130 is reduced (for example, polished), levelling to the top of the inner selector layer (for example, via CMP of SiN that stops on Cu). The resulting structure includes an array 160 of ECRAM devices vertically stacked inside trenches, such as shown in FIGS. 10-13.

The resulting structures avoid cross-talk with neighboring devices for parallel operation of ECRAM devices, selector devices (e.g., transistors, MIEC stacks etc.) connected in series with the gate terminals of ECRAM. The structure avoids cross talk by shutting off paths for charge transfer between adjacent ECRAM devices. The structure also avoids a significant penalty in device foot print as compared to ECRAM devices in which the ECRAM devices are not vertically stacked.

The vertical ECRAM fabricated inside a trench provides benefits, compared to conventional ECRAM, such as saving device area and also encapsulating the electrolyte. In addition, selector devices are formed within the vertical trench and therefore it does not require additional area. This structure enables density scaling of ECRAM cells for neuromorphic computing.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method for forming an array of vertically stacked ECRAM devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an array of vertically stacked electrochemical random-access memory (ECRAM) devices, comprising:

forming at least one hole in a vertical stack of horizontal electrodes, wherein the horizontal electrodes are horizontally aligned and stacked vertically at different vertical levels within the vertical stack and separated by first fill layers;

forming a stack deposition including a channel layer, and an electrolyte layer over the vertical stack and at least one hole;

depositing selector layers to fill the at least one hole, wherein the selector layers include an inner selector layer and outer selector layers;

recessing the channel layer, the electrolyte layer and outer selector layers to the inner selector layer;

depositing an additional fill layer over the vertical stack; and reducing the additional fill layer down to the top of the inner selector layer.

2. The method of claim 1, wherein the selector layers are configured to allow programming of individual ECRAM device without cross-talk.

3. The method of claim 1, wherein a structure of the array of vertically stacked ECRAM devices incorporates a three-terminal electrochemical memory.

4. The method of claim 1, a structure of the array of vertically stacked ECRAM devices encapsulates the electrolyte layer.

5. The method of claim 1, wherein forming at least one hole in a vertical stack of horizontal electrodes further comprises:

etch drilling the at least one hole on the vertical stack of horizontal electrodes with patterning.

6. The method of claim 1, further comprising:

forming the vertical stack of horizontal electrodes via multiple deposition horizontal electrode layers, and barrier layers on the first fill layers and a substrate.

7. The method of claim 1, wherein depositing the selector layers to fill the at least one hole further comprises:

performing chemical mechanical planarization stopping on a barrier layer of the vertical stack.

8. The method of claim 1, wherein the electrolyte layer includes Lithium Phosphorous Oxynitride (LiPON), the channel layer includes tungsten oxide ($WO_3$) and the selector layers include at least one of titanium nitride (TiN) and tungsten (W), silicon oxynitride ($SiO_xN_y$) and at least one of copper (Cu) and silver (Ag).

9. The method of claim 1, wherein the electrolyte layer includes at least one of Hafnium oxide ($HfO_2$) and Cerium oxide (CeO), and the selector layers include at least one of titanium nitride (TiN) and tungsten (W), silicon oxynitride ($SiO_xN_y$) and at least one of copper (Cu) and silver (Ag).

10. The method of claim 1, wherein depositing the selector layers further comprises:

depositing a diffusive memristor to be used as a selector.

11. A semiconductor device including an array of vertically stacked electrochemical random-access memory (ECRAM) devices, comprising:

at least one hole formed in a vertical stack of horizontal electrodes, wherein the horizontal electrodes are horizontally aligned and stacked vertically at different vertical levels within the vertical stack and separated by first fill layers;

a stack deposition, including a channel layer, and an electrolyte layer, formed over the vertical stack and at least one hole;

selector layers filling the at least one hole, wherein the selector layers include an inner selector layer and outer selector layers, wherein the channel layer, the electrolyte layer and outer selector layers are recessed to the inner selector layer; and an additional fill layer deposited over the vertical stack, wherein the fill layer is reduced down to the top of the inner selector layer.

12. The semiconductor device of claim 11, wherein the selector layers are configured to allow programming of individual ECRAM device without cross-talk.

13. The semiconductor device of claim 11, wherein a structure of the array of vertically stacked ECRAM devices incorporates a three-terminal electrochemical memory.

14. The semiconductor device of claim 11, wherein a structure of the array of vertically stacked ECRAM devices encapsulates the electrolyte layer.

15. The semiconductor device of claim 11, wherein the electrolyte layer includes Lithium Phosphorous Oxynitride (LiPON), the channel layer includes tungsten oxide ($WO_3$) and the selector layers include at least one of titanium nitride (TiN) and tungsten (W), silicon oxynitride ($SiO_xN_y$) and at least one of copper (Cu) and silver (Ag).

16. The semiconductor device of claim 11, wherein the electrolyte layer includes at least one of Hafnium oxide ($HfO_2$) and Cerium oxide (CeO), and the selector layers include at least one of titanium nitride (TiN) and tungsten (W), silicon oxynitride ($SiO_xN_y$) and at least one of copper (Cu) and silver (Ag).

17. The semiconductor device of claim 11, wherein the selector layers further comprise a diffusive memristor to be used as a selector.

18. A semiconductor device including an array of vertically stacked electrochemical random-access memory (ECRAM) devices, comprising:

at least one hole formed in a vertical stack of horizontal electrodes, wherein the horizontal electrodes are horizontally aligned and stacked vertically at different vertical levels within the vertical stack and separated by first fill layers;

a stack deposition, including a channel layer, and an electrolyte layer, formed over the vertical stack and the at least one hole, wherein the channel layer includes tungsten oxide ($WO_3$) and the electrolyte layer includes Lithium Phosphorous Oxynitride (LiPON);

selector layers filling the at least one hole, wherein the selector layers include an inner selector layer and outer selector layers, wherein the channel layer, the electrolyte layer and outer selector layers are recessed to the inner selector layer and the inner selector layer includes at least one of copper (Cu) and silver (Ag); and an additional fill layer deposited over the vertical stack, wherein the fill layer is reduced down to the top of the inner selector layer.

19. The semiconductor device of claim 18, wherein a structure of the array of vertically stacked ECRAM devices incorporates a three-terminal electrochemical memory.

20. The semiconductor device of claim 18, wherein a structure of the array of vertically stacked ECRAM devices encapsulates the electrolyte layer.

* * * * *